United States Patent
Muterspaugh et al.

(10) Patent No.: US 9,413,327 B2
(45) Date of Patent: Aug. 9, 2016

(54) APPARATUS AND METHOD FOR FILTERING A SIGNAL

(71) Applicant: THOMSON LICENSING, Issy de Moulineaux (FR)

(72) Inventors: Max Ward Muterspaugh, Westfield, IN (US); Lincheng Xiu, Zionsville, IN (US)

(73) Assignee: Thomson Licensing, Issy les Moulineaux (FR)

( * ) Notice: Subject to any disclaimer, the term of this patent is extended or adjusted under 35 U.S.C. 154(b) by 0 days.

(21) Appl. No.: 14/690,597

(22) Filed: Apr. 20, 2015

(65) Prior Publication Data

US 2015/0303891 A1 Oct. 22, 2015

Related U.S. Application Data

(60) Provisional application No. 61/981,936, filed on Apr. 21, 2014.

(51) Int. Cl.
*H03H 7/46* (2006.01)
*H03H 7/38* (2006.01)
*H03H 7/06* (2006.01)
*H03H 7/01* (2006.01)

(52) U.S. Cl.
CPC . *H03H 7/38* (2013.01); *H03H 7/06* (2013.01); *H03H 7/1758* (2013.01); *H03H 7/1766* (2013.01); *H03H 7/463* (2013.01)

(58) Field of Classification Search
CPC ......... H03H 7/38; H03H 7/06; H03H 7/1758; H03H 7/1766; H03H 7/463
USPC .......................................................... 333/132
See application file for complete search history.

(56) References Cited

U.S. PATENT DOCUMENTS

| | | | |
|---|---|---|---|
| 8,463,228 B2 | 6/2013 | White et al. | |
| 8,677,441 B2 | 3/2014 | Lee | |
| 8,752,114 B1 | 6/2014 | Shapson et al. | |
| 2009/0286569 A1* | 11/2009 | Rousu | H01P 1/213 455/553.1 |
| 2011/0010749 A1* | 1/2011 | Alkan | H03H 1/00 725/127 |
| 2013/0181789 A1 | 7/2013 | Rijssemus | |
| 2013/0332967 A1 | 12/2013 | Chang | |

FOREIGN PATENT DOCUMENTS

WO  WO2013192133  12/2013

* cited by examiner

*Primary Examiner* — Robert Pascal
*Assistant Examiner* — Kimberly Glenn
(74) *Attorney, Agent, or Firm* — Robert D. Shedd; Vincent E. Duffy; Michael A. Pugel

(57) ABSTRACT

A simplified filter structure, and method thereof, for filtering signals received on a network are provided. The present disclosure is directed to a simplified filter structure, arranged as a dual unbalanced cascade diplexer for a plurality of received signals, including satellite, terrestrial, and home networking signals, e.g., Multimedia Over Cable Alliance (MoCA) signals. The simplified filter structure is designed such that signals within a certain predetermined frequency range are passed, while the impedance is matched in the stopband frequency range both above and below the frequency range of the passed signals.

22 Claims, 9 Drawing Sheets

APPARATUS AND METHOD FOR FILTERING A SIGNAL

REFERENCE TO RELATED PROVISIONAL APPLICATION

This application claims priority from U.S. provisional application No. 61/981,936, entitled "Apparatus and Method For Filtering a Signal" filed on Apr. 21, 2014.

TECHNICAL FIELD

The present disclosure generally relates to a communication apparatus that includes circuits for receiving signals from a plurality of sources. More particularly, the present disclosure is related to a simplified multiplex filter used in a receiver device to filter a plurality of received signals, such as satellite, cable, terrestrial, and home network signals, in different frequency ranges.

BACKGROUND

Any background information described herein is intended to introduce the reader to various aspects of art, which may be related to the present embodiments that are described below. This discussion is believed to be helpful in providing the reader with background information to facilitate a better understanding of the various aspects of the present disclosure. Accordingly, it should be understood that these statements are to be read in this light.

Many home entertainment devices not only include the capability to communicate with other devices in a home network but also include the ability to receive and/or process available media content from a plurality of sources, including a plurality of providers. The sources and providers may include, but are not limited to, satellite service, cable service, and free to home over the air terrestrial service. The services may operate in the same or different frequency ranges and may use the same or different transmission formats or protocols. The devices for receiving the services often include, but are not limited to, set-top boxes, gateways, televisions, home computers, and the like. Further, many of these devices may include multiple interfaces for different types of externally provided services as well as different types of home networks. These devices may also include additional features internal to the device, such as storage elements, hard drives, compact disk or digital versatile disk drives, and the like.

In order to receive signals from these different services simultaneously, a filtering structure, such as a multiplex filter, is often used to separate the signals. These filtering structures are particularly important if the services operate in separate frequency ranges and/or use separate transmission formats or protocols. For example, a multiplex filter allows the reception of multiple transmission systems, including terrestrial systems complying with Digital Video Broadcasting television standard (DVB-T2) or the Integrated Services Digital Broadcasting television standard (ISDBT) may be included along with reception of satellite signals. A diplex filter, a type of multiplex filter, is often comprised of a high pass filter for a first high frequency band (e.g., a satellite signal frequency band) and a low pass or band pass filter for a second lower frequency band (e.g., a terrestrial or cable broadcast frequency band).

The operation of home entertainment devices are further complicated by the inclusion of home networking functions in the devices. Many of these devices use a home networking system that shares the transmission medium with the incoming transmission system from the service providers. One such example is a multimedia over cable alliance (MoCA) home networking system that operates in a frequency spectrum on the coaxial cable that is unused by the other signal transmission systems.

A system receiving multiple signals from multiple services over a wide range of frequencies creates significant difficulties in creating a suitable diplex or multiplex filter that provides optimal performance for all services. Previous designs often did not require the additional filtering functions to receive certain terrestrial (e.g., DVB-T2 or ISDBT) broadcast signals along with satellite signals on a common coaxial cable input. The design may be further complicated by the inclusion of an interface to a wired home communication network, such as the MoCA network. For example, frequency guard bands between the frequency ranges for the terrestrial and satellite services may be small in frequency range requiring more selectivity from the filter sections. Further, unused frequency bands between the filters in which undesirable characteristics from the filter sections may be tolerated may not be present. Additionally, systems that did include unused frequency ranges and guard bands may still require a high amount of rejection for signals that are in the frequency range outside of the desired frequency range. Filters used in these systems may still not provide sufficient stopband frequency rejection or may introduce undesired frequency anomalies in the passband frequency response due to interaction between filter sections of a diplex or multiplex filter. Therefore, there is a need for a more optimal filtering structure that allows for reception of multiple signals in separate frequency ranges.

The introduction of home networking use for home entertainment devices has also created the use of new home entertainment devices that share content between one or more main devices and simpler terminal devices connected only to the home network. However, although the simpler device only operates with signals on the home network, the impedance from the device as seen on the coaxial cable network must be matched on all operating frequencies including those not used in a simplified product. The simpler devices often use the same filter structure for the multiplex filter but replace the unused signal processing circuits for receiving signals from the transmission systems with a terminating circuit. However, in this approach, the resulting circuitry can be very complex. Therefore, to reduce cost and size, a simpler solution may be desirable.

SUMMARY

According to one aspect of the present disclosure, an apparatus is provided including a first diplexer that receives signals from multiple sources on a network, the first diplexer having a first filter portion that passes signals above a first predetermined frequency, and a second diplexer that receives the signals above the first predetermined frequency, the second diplexer having a first filter portion passes signals below a second predetermined frequency, the second predetermined frequency being greater than the first predetermined frequency, wherein at least one of a second portion of the first diplexer and a second portion of the second diplexer terminates signals in a respective stopband frequency with a matched impedance.

According to another aspect of the present disclosure, a method is providing including receiving signals at a first diplexer from multiple sources on a network; passing signals above a first predetermined frequency to a second diplexer; receiving the signals above the first predetermined frequency by the second diplexer and passing signals below a second predetermined frequency, the second predetermined frequency being greater than the first predetermined frequency; and terminating signals in at least one of a stopband frequency range of the first diplexer and a stopband frequency range of the second diplexer with a matched impedance.

BRIEF DESCRIPTION OF THE DRAWINGS

These, and other aspects, features and advantages of the present disclosure will be described or become apparent from the following detailed description of the preferred embodiments, which is to be read in connection with the accompanying drawings.

Figure 1:
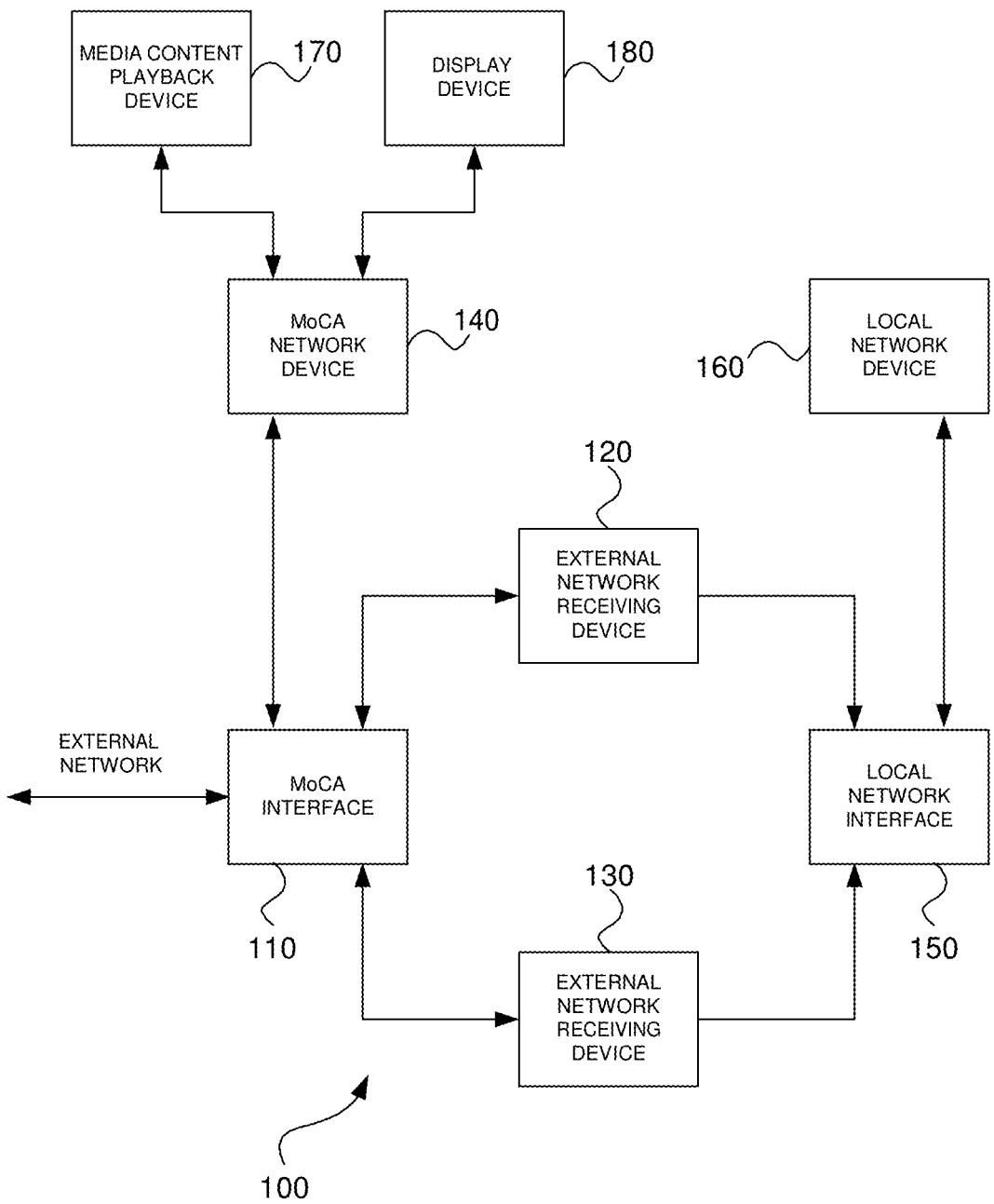
FIG. 1 is a block diagram of an exemplary signal receiving system in a home or dwelling in accordance with the present disclosure.

It should be understood that the drawing(s) are for purposes of illustrating the concepts of the disclosure and is not necessarily the only possible configuration for illustrating the disclosure.

DESCRIPTION OF EMBODIMENTS

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces. Herein, the phrase "coupled" is defined to mean directly connected to or indirectly connected with through one or more intermediate components. Such intermediate components may include both hardware and software based components.

The present description illustrates the principles of the present disclosure. It will thus be appreciated that those skilled in the art will be able to devise various arrangements that, although not explicitly described or shown herein, embody the principles of the disclosure and are included within its scope.

All examples and conditional language recited herein are intended for educational purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read only memory (ROM) for storing software, random access memory (RAM), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

The present disclosure is directed to a simplified filter structure that may be used as a termination circuit for multiple frequency bands. For instance, in a portion of a first diplexer, the terminated frequency bands may include the Integrated Services Digital Broadcasting television standard (ISDB-T) band as well as termination for a lower frequency communication channel, such as a single wire module (SWM) communication channel for satellite signals. Furthermore, a second simplified filter may be used as a satellite frequency band termination circuit in another portion of the diplexer. The arrangement results in a dual unbalanced cascade diplexer that includes one or more filters for passing signals in a home network while simultaneously providing a proper impedance termination for other devices connected to the same wired interfaced in the stopband frequency range.

The termination of the signal or more particularly, any signal energy, that is present within the stopband frequency using a proper impedance is usually necessary to minimize the introduction of signal impairments into the wired interface, such as a coaxial cable. The wired interface may be used to connect a plurality of devices together in order to provide communication signals (e.g., satellite or MoCA signals) to and between the devices. The proper termination impedance is often similar to or the same as the characteristic impedance or resistance of the wired interface (e.g., 50 ohms or 75 ohms). The termination impedance prevents signal energy that may be delivered to a device through the wired interface from being reflected back onto the wired interface. The reflected signal energy produces standing waves along the wireless interface and produces signal echoes and other similar signal impairments that reduce the performance of other devices receiving the signal. The need for terminating a signal on the wired interface using proper terminating impedance, particularly in a stopband frequency range of a filter structure, and the advantages of the present embodiments will be described in further detail below.

Described herein are mechanisms for implementing a filtering structure in a device connected to a network containing signals from multiple sources. In one embodiment, the filter structure may be directed at operations involving ISDB-T signals, satellite signals, and Multimedia over Cable Alliance (MoCA) signals. It is important to note that these mechanisms may be adapted for use in other systems with different signals from different sources. For instance, with only minor modifications, the embodiments described below could be modified by a skilled artisan to work in a network connected device operating with signals provided from a source using the Advanced Television Standards Committee (ATSC) format or from a cable signal service provider. Further, these mechanisms may also be adapted to operate at different frequency ranges, including the home network signal being above or below the frequency range for the other signals.

Turning now to drawings and referring initially to FIG. 1, a block diagram of an embodiment of a system 100 for providing home entertainment media content in a home, or end user, network is shown. The media content, originating from a content provider, is provided through an external network to a MoCA interface 110. The media content may be provided using any one of the standard transmission protocols and standards for content delivery (e.g., Advanced Television Systems Committee (ATSC) A/53, digital video broadcast (DVB)-Cable (DVB-C), DVB-Satellite (DVB-S), or DVB-Terrestrial (DVB-T)). MoCA interface 110 is connected to external network receiving device 120, external network receiving device 130, and MoCA network device 140. Both external network receiving device 120 and external network receiving device 130 connect to local network interface 150. Local network interface 150 connects to local network device 160. Media content playback device 170 connects to MoCA network device 140. MoCA network device 140 connects to display device 180. The components shown in system 100 comprise a home network configured to provide media content to multiple locations within the home using one or more home communication networks.

A signal containing media content (e.g., audio, video, and/or data) from the external network is provided over a physical media, such as co-axial cable. The external network interfaces to MoCA interface 110. MoCA interface 110 provides a routing mechanism for the signal from the external network to devices in the home or user network (e.g., external network receiving device 120 and external network receiving device 130) in conjunction with signals that operate in the MoCA network with the home or user network. MoCA interface 110 may include active or passive circuit elements that may split or separate the input signal into different or similar output signals. MoCA interface 110 may use amplifiers, frequency filters, and electromagnetic circuits to split or separate the signal. In one embodiment, the external network provides a signal on a co-axial cable between the frequency range of 20 Megahertz (MHz) and 800 MHz. The MoCA network operates using signals in the frequency range from 950 MHz to 1,250 MHz. In an alternative embodiment, the external network provides a signal between the frequency range of 950 MHz and 2,150 MHz with the MoCA network operating in the frequency range of 475 MHz to 625 MHz. MoCA interface 110 provides signal splitting for signals from the external network and a separate signal splitting for signals on the MoCA network while preventing signals from the MoCA network from being output to the external network.

External network receiving device 120 and external network receiving device 130 may each operate and function in a similar manner. External network receiving device 120 and external network receiving device 130 receive the signal from the external network through the MoCA interface 110. External network receiving device 120 and external network receiving device 130 may receive different types of media content (e.g., different channels) from either the external network or from other devices in the home network through either MoCA interface 110 or local network interface 150. External network receiving devices 120 and 130 tune, demodulate, decode, and process the received content and provide the content for display and use by a user in the home. External network receiving devices 120 and 130 may further provide a separation of the media content based on instructions provided with the content or over the external network. External network receiving devices 120 and 130 may also process and separate media content based on instructions received via user commands. External network receiving devices 120 and 130 may also provide storage, such as a hard drive or optical disk drive, for recording and/or storing the media content as well as providing the content for playback to other devices in a home network (e.g., MoCA network device 140 and local network device 160). The operation and function of an external network receiving device, such as discussed here, will be described in further detail below. External network receiving devices 120 and 130 may be one of a settop box, home media server, computer media station, home network gateway, multimedia player, modem, router, home network appliance, or the like.

External network receiving devices 120 and 130 provide interfaces for communicating signals on the MoCA network through MoCA interface 110 to and from other MoCA network devices (e.g., external network receiving devices 120 and 130 and MoCA network device 140). External network receiving devices 120 and 130 also provide interfaces to a local home network through local network interface 150 to local network device 160. In one embodiment, the local network is an Ethernet network. In addition, the local network may be a wireless network. Wireless communication using a wireless network may include physical interfaces to accommodate one or more wireless formats including Wi-Fi, Institute of Electrical and Electronics Engineers (IEEE) standard 802.11 or other similar wireless communications protocols.

MoCA interface 110 provides MoCA network signals between external network receiving device 120, external network receiving device 130, and MoCA network device 140. MoCA network device 140 tunes, demodulates, and decodes MoCA signals for display and use by a user. MoCA network device 140 may also transmit or communicate signals on the MoCA network for delivery to other devices (e.g., external network receiving device 120 or 130). These signals may provide control or identification information for media content to be delivered to the MoCA network device 140. The MoCA network device 140 is often referred to as a thin client MoCA device and may be, but is not limited to, a settop box, setback box, computer device, tablet, display device, television, wireless phone, personal digital assistant (PDA), gaming platform, remote control, multi-media player, or home networking appliance that includes a MoCA interface, and may further include a storage media for digital video recording. MoCA network device 140 may also include a storage device, such as a hard drive or optical disk drive, for recording and playing back audio and video content.

Local network interface 150 provides the routing and signal communication and management functions between devices communicating across the local network. In one embodiment, local network interface 150 operates as a signal router for communicating using internet protocol routing protocols as part of an Ethernet network.

Local network interface 150 provides local network signals between external network receiving device 120, external network receiving device 130, and local network device 160. Local network device 160 also may tune, demodulate, and/or decode the local network signals for display and use by a user depending on the communication protocol used. Local network device 160 may also transmit or communicate signals on the local network for delivery to other devices (e.g., external network receiving device 120 or 130). These signals may provide control or identification information for media content to be delivered to the local network device 160. The local network device 160 is often referred to a thin client device and may be, but is not limited to, a computer device, tablet, display device, television, wireless phone, personal digital assistant (PDA), gaming platform, remote control, multi-media player, or home networking appliance that includes a local network interface. Local network device 160 may further include a storage media for digital media recording.

Media content playback device 170 provides local source playback for one or more formats of media content from an internal or separate media element. Media content playback device 170 may include a compact disc (CD) drive, DVD drive, Blu-Ray drive, a hard disk drive, an electronic memory, or other storage or storage access element. Media content playback device 170 reads the media content from the media element and outputs the media content in one or more audio/video signal formats (e.g., HDMI). The audio/video signals are provided to MoCA network device 140.

Display device 180 receives and displays audio/video signals from the MoCA network device 140. The audio/video signals may either be from media content playback device 170 or may be from external network receiving devices 120 and 130 through MoCA interface 110. Display device 180 may be a conventional two-dimensional (2-D) type display or may alternatively be an advanced three-dimensional (3-D) type display.

It is important to note that external network receiving devices 120 and 130 and local network device 160 may include display capability or may be connected to an external display device, not shown. Further, external network receiving devices 120 and 130 and local network device 160 may include interfaces for connecting a media content playback device, such as media content playback device 170. It should be appreciated that other devices having display capabilities including, but not limited to, computer devices, tablets, gateways, display devices, televisions, wireless phones, PDAs, computers, gaming platforms, remote controls, multi-media players, home networking appliances or the like, may employ the teachings of the present disclosure and are considered within the scope of the present disclosure.

In operation, system 100 provides the networking and communication capability for connecting and sharing media content between devices in a user's home using either the MoCA network, or the local network, or both networks. In one embodiment, media content for a particular program is tuned by external network receiving device 120 and provided to MoCA network device 140 through MoCA interface 110 for viewing on display device 180. MoCA network device 140 may operate using a frequency range described as high RF MoCA. As the other devices, such as external network receiving device 120 and 130, share the network, other signals, such as SWM communication, ISDB-T, and L band satellite signals, may be present and must operate unimpaired by the operation of MoCA network device 140. As a result, MoCA network device 140 needs to provide impedance matching for terminated signals in the other frequency ranges present in the system 100. In one embodiment, a simplified filter to separate a band of frequencies used in a device while providing a desired matching impedance to other frequencies present in a network is employed in MoCA network device 140. Further details regarding the simplified filter will be described below.

It should be appreciated by one skilled in the art that system 100 in FIG. 1 is described primarily as operating with a local MoCA network and a second local network, such as an Ethernet network. However, other network standards that incorporate either a wired or wireless physical interface may be used. For instance, the second local network may be a wireless network using WiFi, Bluetooth, or IEEE 802.11. Other wired networks, such as phone line or power line networks, may be used in place of the MoCA network. Further, more than two networks may be used either alternatively or simultaneously together.

Figure 2:
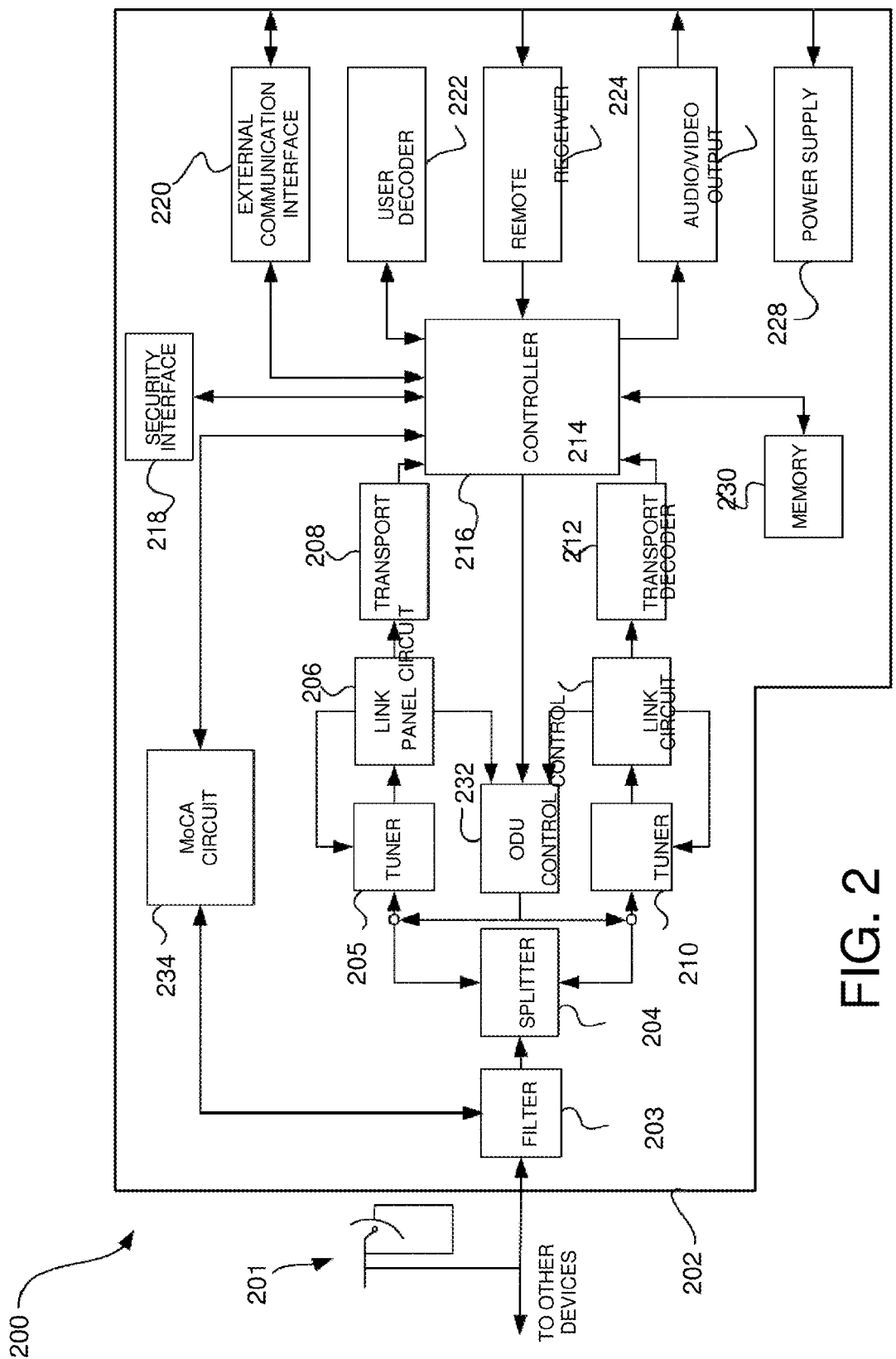
FIG. 2 is a block diagram of another exemplary signal receiving system including a signal receiving device in accordance with the present disclosure.

Turning now to FIG. 2, another exemplary signal receiving system 200 using aspects of the present disclosure is shown. System 200 primarily receives signals from one or more satellites as well as multiple television broadcast transmission sites. The signals are provided by one or more service providers and represent broadcast audio and video programs and content. System 200 is described as including components that reside both inside and outside a user's premises. It is important to note that one or more components in system 200 may be moved from inside to outside the premises. Further, one or more components may be integrated with a display device, such as a television or display monitor (not shown). In either case, several components and interconnections necessary for complete operation of system 200 are not shown in the interest of conciseness, as the components not shown are well known to those skilled in the art.

An outdoor unit (ODU) 201 receives signals from satellites and from terrestrial transmission towers through an over the air and/or near earth orbit communications link. ODU 201 is connected to set top box 202. Within set top box 202, the input is connected to filter 203. Optionally, filter 203 can be connected to splitter 204. Filter 203 is coupled to three signal processing paths. A first path includes tuner 205, link circuit 206, and transport decoder 208 connected together serially. A second path includes tuner 210, link circuit 212, and transport decoder 214 connected together serially. A third path includes MoCA circuit 234, which further connects to controller 216. The outputs of transport decoder 208 and transport decoder 214 each connect to controller 216. Controller 216 connects to security interface 218, external communication interface 220, user panel 222, remote control receiver 224, audio/video output 226, power supply 228, memory 230, and ODU control 232. External communication interface 220, remote control receiver 224, audio/video output 226, and power supply 228 provide external interfaces for the set top box 202. ODU control 232 also connects to the filter 203.

Satellite signal streams, each containing a plurality of channels, are received by ODU 201. ODU 201 includes a dish for capturing and focusing the propagated radio waves from the atmosphere onto one or more antennas contained within a structure known as a low noise block converter (LNB). ODU 201 may be configured to receive the signal streams from satellite transponders located on one or more satellites. In a preferred embodiment, two sets of sixteen channels are received by ODU 201, and converted, using one or more LNBs to a frequency range of 950 Megahertz (MHz) to 2,150 MHz, referred to as L-band. ODU 201 also includes a terrestrial antenna for receiving over the air broadcasts. In a preferred embodiment, ODU 201 includes a multiple element antenna array for receiving ISDB-T signals in the frequency range from 174 MHz to 806 MHz.

ODU 201 provides a converted signal stream to the set top box 202 through radio frequency (RF) co-axial cable. The converted signal stream is provided to filter 203. In a preferred embodiment, filter 203 operates as a multiplex filter with up to three separate filter sections or interfaces. The frequency response properties of filter 203 may include a separate highpass filter and lowpass filter such that the frequency passbands of each do not overlap. The arrangement, referred to as a diplexer or diplex filter, allows for a separation, through signal filtering, of the incoming satellite signal and/or MoCA signal from the terrestrial signal and/or MoCA signal.

In a preferred embodiment, the low pass filter frequency response pass band ends at a frequency below 900 MHz. The low pass filter portion allows a MoCA signal in a frequency range from 475 MHz to 625 MHz as well as a terrestrial signal in the frequency range from 174 MHz to 806 MHz to pass through to subsequent blocks while attenuating, or not passing through, a satellite signal in a frequency range from 950 MHz to 2,150 MHz. The high pass filter portion operates in an opposite manner passing the MoCA signal, in the frequency range around 1100 MHz, along with the satellite signal through and attenuating cable or terrestrial broadcast signal. The high pass filter portion may also filter any electrical supply or communication signals provided to the ODU 201. An additional bandpass filter circuit may be provided to further process MoCA signals and provide the signals as an output to a home MoCA network or for processing in set top box 202. Other embodiments may be possible and some of these embodiments are described in further detail below. Filter 203 may also include surge or transient voltage protection devices.

The output signal from the high pass filter portion of filter 203 is provided to a first signal path containing a tuner 205, a link circuit 206, and a transport decoder 208 connected in a serial fashion. The output signal from the low pass filter portion of the filter 203 is provided to a second signal path. The second signal path also contains a tuner 210, a link circuit 212, and a transport decoder 214 connected in a serial fashion. Each processing path may perform similar processing on the filtered signal streams, the processing being specific to the transmission protocol used.

Tuner 205 processes the split signal stream by selecting or tuning one of the channels provided from a satellite service provider in the highpass filtered signal stream to produce one or more baseband signals. Tuner 205 contains circuits (e.g., amplifiers, filters, mixers, and oscillators) for amplifying, filtering and frequency converting the satellite signal stream. Tuner 205 typically is controlled or adjusted by link circuit 206. Alternately, tuner 205 may be controlled by another controller, such as controller 216, which will be described later. The control commands include commands for changing the frequency of an oscillator used with a mixer in tuner 205 to perform the frequency conversion.

Tuner 210 processes the lowpass filtered signal stream by selecting or tuning one of the terrestrial or cable broadcast channels in the split signal stream to produce one or more baseband signals. Tuner 210 contains circuits (e.g., amplifiers, filters, mixers, and oscillators) for amplifying, filtering and frequency converting the signal stream. Tuner 210 may be controlled or adjusted in a manner similar to that described earlier for tuner 205.

Typically, the baseband signals at the output of tuner 205 or tuner 210 may collectively be referred to as the desired received signal and represent one satellite channel selected out of a group of channels that were received as the input signal stream. Although the signal is described as a baseband signal, this signal may actually be positioned at a frequency that is only near to baseband.

The one or more baseband signals from the satellite service provider are provided to link circuit 206 through tuner 205. Link circuit 206 typically contains the processing circuits needed to convert the one or more baseband signals into a digital signal for demodulation by the remaining circuitry of link circuit 206. In one embodiment, the digital signal may represent a digital version of the one or more baseband signals. In another embodiment, the digital signal may represent the vector form of the one or more baseband signals. Link circuit 206 also demodulates and performs error correction on the digital signal from the satellite service provider to produce a transport signal. The transport signal may represent a data stream for one program, often referred to as a single program transport streams (SPTS), or it may represent multiple program streams multiplexed together, referred to as a multiple program transport stream (MPTS).

The one or more baseband signals from the broadcast service provider are provided to link circuit 212 through tuner 210. Link circuit 212 typically contains the processing circuits needed to convert the one or more baseband signals into a digital signal for demodulation by the remaining circuitry of link circuit 212 in a manner similar to link circuit 206 described earlier. Link circuit 212 also demodulates and performs broadcast channel equalization error correction on the digital signal from the broadcast service provider to produce a transport signal. As described earlier, the transport signal may represent a data stream for one program or it may represent multiple program streams multiplexed together.

The transport signal from link circuit 206 is provided to transport decoder 208. Transport decoder 208 typically separates the transport signal, which is provided as either a SPTS or MPTS, into individual program streams and control signals. Transport decoder 208 also decodes the program streams, and creates audio and video signals from these decoded program streams. In one embodiment, transport decoder 208 is directed by user inputs or through a controller such as controller 216 to decode only the one program stream that has been selected by a user and create only one audio and video signal corresponding to this one decoded program stream. In another embodiment, transport decoder 208 may be directed to decode all of the available program streams and then create one more audio and video signals depending on user request.

The transport signal from link circuit 212 is similarly provided to transport decoder 214. Transport decoder 214 decodes the program streams, and creates audio and video signals from these decoded program streams as directed by user inputs or a controller in a manner similar to that described earlier for transport decoder 208.

The audio and video signals, along with any necessary control signals, from both transport decoder 208 and transport decoder 214 are provided to controller 216. Controller 216 manages the routing and interfacing of the audio, video, and control signals and, further, controls various functions within set top box 202. For example, the audio and video signals from transport decoder 208 may be routed through controller 216 to an audio/video (NV) output 226. AN output 226 supplies the audio and video signals from set top box 202 for use by external devices (e.g., televisions, display monitors, and computers). Also, the audio and video signals from transport decoder 214 may be routed through controller 216 to memory block 230 for recording and storage.

Memory block 230 may contain several forms of memory including one or more large capacity integrated electronic memories, such as static random access memory (SRAM), dynamic RAM (DRAM), or hard storage media, such as a hard disk drive or an interchangeable optical disk storage system (e.g., compact disk drive or digital video disk drive). Memory block 230 may include a memory section for storage of instructions and data used by controller 216 as well as a memory section for audio and video signal storage. Controller 216 may also allow storage of signals in memory block 230 in an alternate form (e.g., an MPTS or SPTS from transport decoder 208 or transport decoder 214).

Controller 216 is also connected to an external communications interface 220. External communication interface 220 may provide signals for establishing billing and use of the service provider content. External communications interface 220 may include a phone modem for providing phone connection to a service provider. External communications interface 220 may also include an interface for connection to an Ethernet network and/or to home wireless communications network. The Ethernet network and/or home wireless network may be used for communication data, audio, and/or video signals and content to and from other devices connected to the Ethernet network and/or home wireless network (e.g., other media devices in a home).

Controller 216 also connects to a security interface 218 for communicating signals that manage and authorize use of the audio/video signals and for preventing unauthorized use. Security interface 218 may include a removable security device, such as a smart card. User control is accomplished through user panel 222, for providing a direct input of user commands to control the set top box and remote control receiver 224, for receiving commands from an external remote control device. Although not shown, controller 216 may also connect to the tuners 205, 210, link circuits 206, 212, and transport decoders 208, 214 to provide initialization and set-up information in addition to passing control information between the blocks. Finally, power supply 228 typically connects to all of the blocks in set top box 202 and supplies the power to those blocks as well as providing power to any of the elements needing power externally, such as the ODU 201.

Controller 216 also controls ODU control 232. ODU control 232 provides signaling and power supply electrical power back to the ODU 201 through filter 203. ODU control 232 provides these signals and power onto the co-axial cable(s) running between ODU 201 and set top box 202. In one embodiment, the ODU control 232 receives input control signals from controller 216 and provides different DC voltage levels to specific portions of the ODU 201 to provide a certain signal stream containing a set of programs or content to filter 203 and further to tuner 205 and tuner 210. In another embodiment, the ODU control 232 receives inputs from controller 216 and also from link circuit 206 and link circuit 212 and provides DC voltage levels and a separate tuning control signal to ODU 201 using low frequency carrier based frequency shift keying modulation or using SWM format. Controller 216 also may send control commands to disable ODU controller 230 from providing either direct current (DC) voltages or control signals to ODU 201.

MoCA circuit 234 amplifies and processes the MoCA signal both for reception and transmission. As described above, the MoCA interface permits communications of audio and video signals in a home network and may operate bi-directionally. MoCA circuit 234 includes a low noise amplifier for improving reception performance of a MoCA signal received by signal receiving device 202 from another network connected device. The received and amplified signal is tuned, demodulated, and decoded. The decoded signal may be provided to a number of other circuits, including audio and video outputs as well as a mass storage device (e.g., hard disk drive, optical drive, and the like), not shown. Additionally, MoCA circuit 234 generates and formats the MoCA transmit signal using audio and video content available in the signal receiving device, including content received from the input (e.g., satellite signal) and content from the mass storage device. MoCA circuit 234 also includes a power amplifier for increasing the transmitted signal level of the MoCA signal sent by system 200 to another network connected device. Adjustment of the receive signal amplification as well as the transmit signal amplification in MoCA circuit 234 may be controlled by controller 216.

It should be appreciated by one skilled in the art that the blocks described inside set top box 202 have important interrelations, and some blocks may be combined and/or rearranged and still provide the same basic overall functionality. For example, transport decoder 208 and transport decoder 214 may be combined and further integrated along with some or all of the functions of controller 216 into a System on a Chip (SoC) that operates as the main controller for set top box 202. Further, control of various functions may be distributed or allocated based on specific design applications and requirements. As an example, link circuit 206 may provide control signals to ODU control 232 and no connection may exist between link circuit 212 and ODU control 232.

Further, it should be appreciated although ODU 201 includes both a dish and LNB for use with satellite signals and a terrestrial antenna, other embodiments may use separate structures. In some embodiments, the satellite dish and LNB may be included in one structure and the terrestrial antenna is part of a second structure. The outputs of both satellite dish/LNB structure and terrestrial antenna are combined using a signal combining circuit and provided to set top box 202.

Although set top box 202 is described above as receiving a single converted signal stream, set top box 202 may also be configured to receive two or more separate converted signal streams supplied by ODU 201 in some modes of operation. Operation in these modes may include additional components including switches and/or further tuning and signal receiving components, not shown. Further, set top box 202 may be designed to operate only on a home network using the Ethernet or home wireless network interfaces described above. In this case, the elements associated with operation in a MoCA network may be removed from set top box 202.

As discussed above, there are certain simpler devices (e.g., set top boxes) that only operate with signals in one frequency range (e.g., home network or MoCA frequency range). Even though simpler devices only operate with signals in one frequency range, the impedance from the device as seen on the network must be matched on all frequencies, including those not used in the simpler device. The simpler device may use conventional multiplex filtering designs by replacing the unused signal processing circuits for receiving signals from the transmission systems with a terminating circuit. However, in this approach, the resulting circuitry can be unnecessarily complex. Instead, in an embodiment of the present disclosure, elliptic filters may be used to create a simpler filtering structure that still matches the impedance for terminated frequencies.

Figure 3:
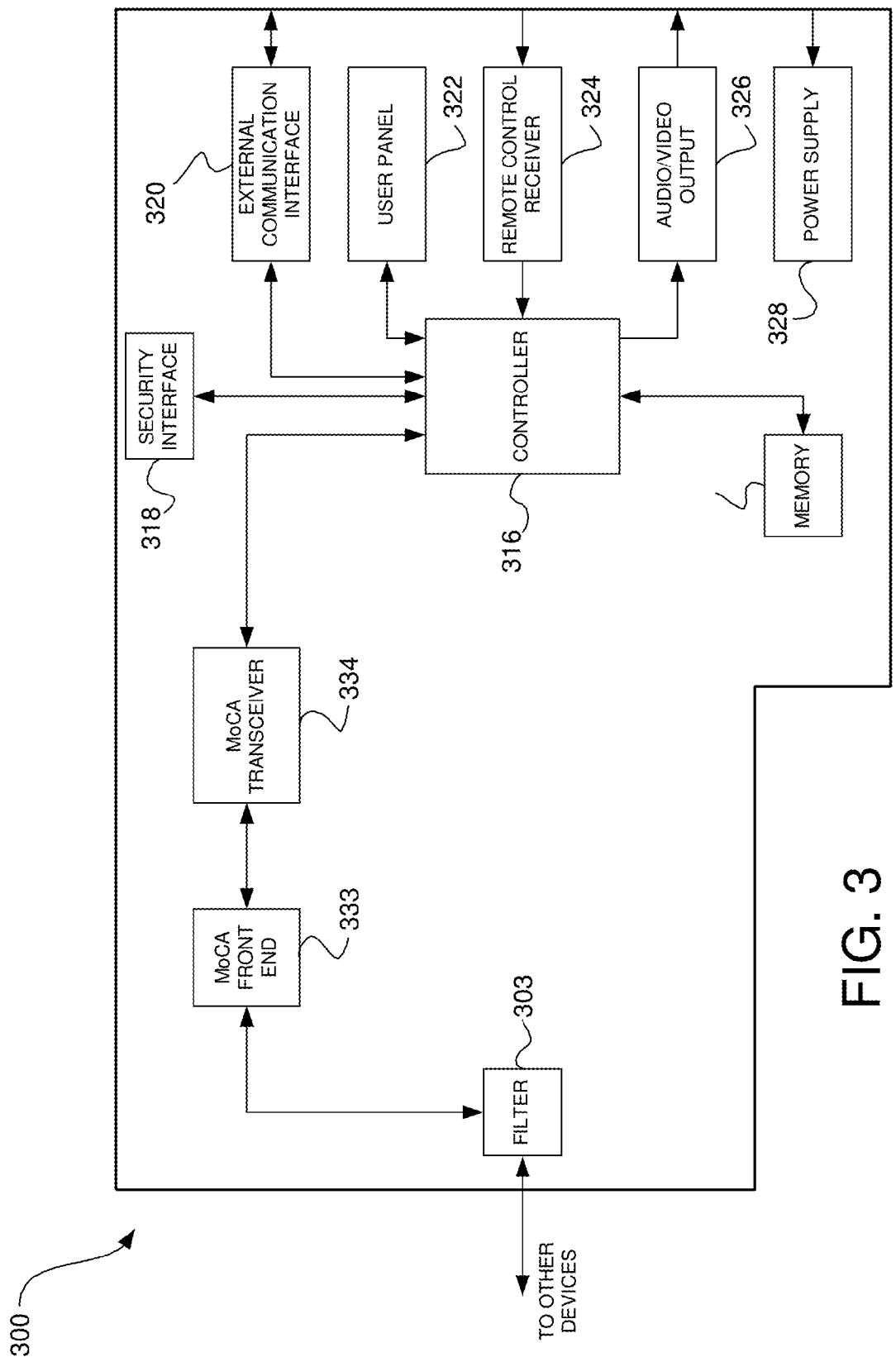
FIG. 3 is a block diagram of an exemplary network device in accordance with the present disclosure.

Turning now to FIG. 3, a block diagram of an exemplary network device 300 using aspects of the present disclosure is shown. Network device 300 operates in a manner similar to MoCA network device 140 described in FIG. 1. Network device 300 primarily operates on a home network. It is important to note that one or more components may be integrated with a display device, such as a television or display monitor (not shown). In either case, several components and interconnections necessary for complete operation of network device 300 are not shown in the interest of conciseness, as the components not shown are well known to those skilled in the art.

A signal from an internal or home network (e.g., MoCA network) is interfaced to network device 300 at filter 303. Filter 303 connects to MoCA front end 333. MoCA front end 333 connects to MoCA transceiver 334. MoCA transceiver 334 further connects to controller 316. Controller 316 connects to security interface 318, external communication interface 320, user panel 322, remote control receiver 324, audio/video interface 326, power supply 328, and memory 330. External communication interface 320, remote control receiver 324, audio/video output 326, and power supply 328 provide external interfaces for the network device 300. Except as described below, the elements in network device 300 operate and function in a manner similar to those similarly numbered elements described for set-top 202 described in FIG. 2 and will not be described further here.

The MoCA home network signal, containing audio, video, and/or data program content is received through a cable (e.g., a coaxial cable) from a central distribution unit (e.g., set-top box 202 described in FIG. 2 or external network receiving device 120 or 130 described in FIG. 1) and is passed through filter 303. Filter 303 passes the MoCA signal through while attenuating other signals present on the cable. Filter 303 also filters any undesired signals transmitted from MoCA front end 333. In one embodiment, filter 303 includes a first diplexing portion that highpass filters the MoCA signal while filtering out the other signals in a frequency range below the MoCA signal. The first diplexing portion also simultaneously provides a proper terminating impedance on the network in the frequency range for the signals in the frequency range below the MoCA signal. Filter 303 also includes a second diplexing portion that lowpass filters the MoCA signal while filtering out the other signals in a frequency range above the MoCA signal. The second diplexing portion also simultaneously provides a proper terminating impedance on the network in the frequency range for the signals in the frequency range above the MoCA signal. MoCA front end 333 includes tuners and amplifiers used for receiving the MoCA signal as well as transmitting a MoCA signal from network device 300 to the home network. The tuned input signal from RF front end 333 is provided to MoCA transceiver 334. MoCA transceiver 334 demodulates the tuned input signal and provides audio, video, and/or data program content signals to controller 316.

Controller 316 converts the signal received from the MoCA network through MoCA transceiver 334, in a serial Ethernet or reduced gigabit media independent interface format, and may provide the converted signal to other elements in network device 300. Similarly, controller 316 may receive and convert inputs from one or more of the elements in network device 300 and provide the signal to MoCA transceiver 334 for transmission to other devices on the MoCA home network.

Figure 4:
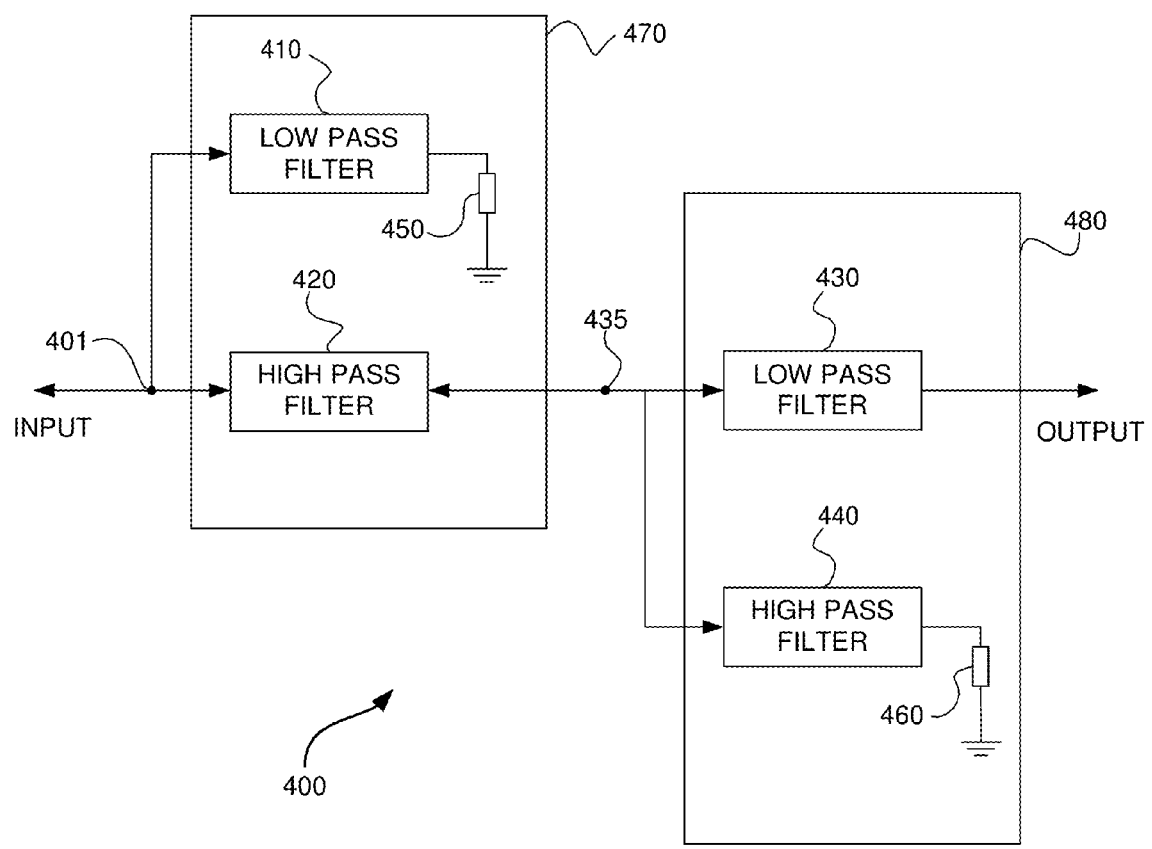
FIG. 4 is a block diagram of an exemplary filter used in a device in accordance with the present disclosure.

Turning to FIG. 4, a block diagram of a filter 400 used in a device according to aspects of the present disclosure is shown. Filter 400 includes one input and provides one output and two additional termination points. Filter 400 may operate in a manner similar to a diplex filter or multiplex filter and may include characteristics similar to those described earlier for filter 203 described in FIG. 2. Filter 400 may further operate in a manner similar to filter 303 described in FIG. 3. Filter 400 may also be used in a device connected into a home network, such as MoCA network device 140 described in FIG. 1.

Filter 400 includes lowpass filter 410 and highpass filter 420 connected to an input. It is to be appreciated that the input connected to filter 400 may be an output from any device on system 100, 200, or 300 for receiving signals from multiple sources. The output of lowpass filter 410 is connected to terminating element 450. Collectively, lowpass filter 410, terminating element 450, and highpass filter 420 comprise a first diplexer 470. The output of highpass filter 420 is connected to lowpass filter 430 and highpass filter 440. Highpass filter 440 connects to terminating element 460. Collectively, lowpass filter 430, highpass filter 440 and terminating element 460 comprise a second diplexer 480. Signals passed by lowpass filter 430 are provided to an output. For instance, the output may be other MoCA circuits (e.g., MoCA front end 333 described in FIG. 3).

In use, at the input of filter 400, filter 400 receives signals from multiple sources. For instance, the received signals may include both satellite and terrestrial or cable broadcast signals as well as home network or MoCA signals. When filter 400 first receives signals, the received signals are provided to diplexer 470. In diplexer 470, the received signals are provided to lowpass filter 410 and highpass filter 420.

From the received signals, highpass filter 420 passes the home network or MoCA signals with frequencies above 950 MHz for use in MoCA signal processing circuits. Highpass filter 420 rejects or attenuates the terrestrial or cable broadcast signals and prevents these signals from appearing in MoCA signal processing circuits in the network device. It is important to note that highpass filter 420 operates bidirectionally, receiving signals from the network for the network device and providing signals to the network from the network device.

In contrast to highpass filter 420, lowpass filter 410 rejects or attenuates home network or MoCA signals with frequencies above 950 MHz. However, the terrestrial or cable broadcast signals and any lower frequency SWM satellite communication signals, are filtered and passed through lowpass filter 410. The signals passing through lowpass filter 410 are terminated (i.e., not passed further) at element 450.

The signal at the output of highpass filter 420, still including both satellite home network or MoCA signals, are provided to the second diplexer 480 of filter 400. The signals provided to diplexer 480 are provided to lowpass filter 430 and highpass filter 440. Lowpass filter 430 passes the home network or MoCA signals with frequencies below 1050 MHz for use in MoCA signal processing circuits. Lowpass filter 430 rejects or attenuates the satellite signals and prevents these signals from appearing in MoCA signal processing circuits in the network device. It is important to note that lowpass filter 430 operates bidirectionally similar to highpass filter 420.

In contrast to lowpass filter 430, highpass filter 440 rejects or attenuates the home network or MoCA signals with frequencies below 950 MHz. However, the satellite communication signals, are filtered and passed through highpass filter 440. The signals passing through highpass filter 440 are terminated (i.e., not passed further) at element 460.

To improve the stopband rejection of one or more of the filter sections (e.g., highpass filter 420 and lowpass filter 430) the filter design for the filter sections may be improved by adding transmission stopband zeroes as circuit elements. Alternatively, certain elements in the filter sections may be adjusted or augmented to create one or more transmission stopband zeroes. To prevent interactions and other circuit anomalies for frequency response in the filter sections, the circuit elements in the filter sections for the creation of the transmission stopband are located at the opposite end of the filter from the common connection point 435 (i.e., the connection between highpass filter 420 and highpass filter 440).

Although FIG. 4 illustrates diplexer 470 and diplexer 480 including terminating elements 450 and 460 respectively, it is to be appreciated that diplexer 470 or diplexer 480 may be designed without terminating element 450 or terminating element 460 as may be necessary by the filtering requirements of different networks and devices. Any design of filter 400 including only one terminating element in filter 400 (i.e., diplexer 470 or diplexer 480 will not have a terminating element) is contemplated to be within the scope of the present disclosure. Furthermore, any design of filter 400 where filter 400 has no terminating element is also contemplated to be within the scope of the present disclosure.

Figure 5:
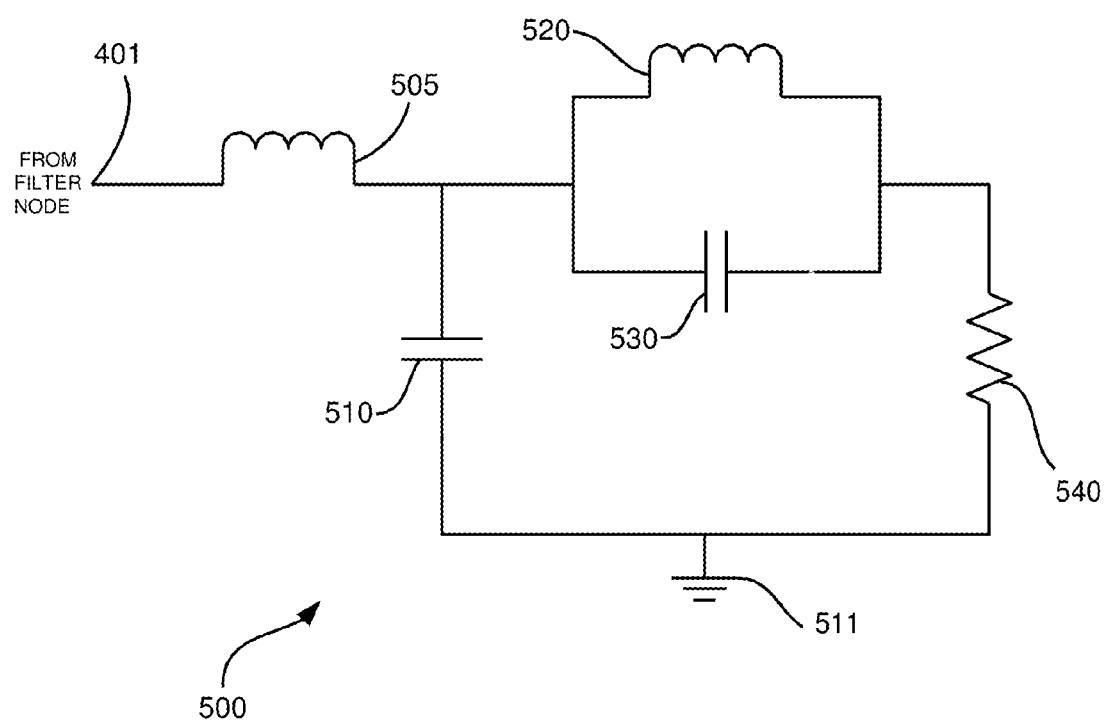
FIG. 5 is a circuit diagram of an exemplary filter section used in a filter in accordance with the present disclosure.

Turning to FIG. 5, a circuit diagram of a filter 500 used as a portion of filter 400 according to aspects of the present disclosure is shown. Filter 500, more specifically, illustrates the lowpass filter 410 and terminating element 450 of filter 400 in FIG. 4. Filter 500 addresses issues related to operational and performance effects caused by interaction between the filters and, more specifically, addresses the simplification of a filter structure used to maintain proper termination for signals (e.g., ISDB-T and SWM signals) in a frequency range below the frequency range for a home network signal (e.g., MoCA signal).

In filter 500, the input node 401 (shown in FIG. 4) of filter 400 (e.g., the connection point between element 410 and element 420 in FIG. 4) connects to one end of inductor 505. The other end of inductor 505 connects to one end of capacitor 510. The one end of capacitor 510 connects to one end of both inductor 520 and capacitor 530 in parallel. The other end of capacitor 510 connects to ground 511. The other ends of both inductor 520 and capacitor 530 both connect to resistor 540. The other end of resistor 540 connects to ground 511.

Filter 500 forms a three pole elliptic type filter with one transmission zero. It is to be appreciated that filter 500 may not offer sufficient stop band attenuation for a signal that would be passed through the filter. However, because filter 500 is used as termination circuit into resistor 540, it is not necessary for filter 500 to provide sufficient stop band attenuation. Instead, filter 500, when terminated with resistor 540, offers a good terminating impedance for the frequency range below the MoCA signal and further provides a sufficient diplex filter characteristic to minimize interaction with the other filter elements (e.g., highpass filter 420 described in FIG. 4). Inductor 505 and capacitor 510 provide an impedance interface as well as a first and second lowpass transmission pole to the other filter elements. Inductor 520 provides a third lowpass transmission pole and further form a transmission zero in the filter stopband in conjunction with capacitor 510.

It is important to note that the location in frequency for the transmission zero in the stopband may affect the termination performance for the filter section. Further, the bandwidth, or 3 dB power points of the frequency response for the transmission zero, may be adjusted to improve the impedance termination performance. Such an adjustment is not typical in conventional filter designs.

It is also important to note that filter 500 may be easily converted for use as a highpass filter (e.g., highpass filter 440 in FIG. 4) by replacing inductor 505 with a capacitor and capacitor 510 with an inductor. Values for each element in filter 500 would also be changed to account for the difference in frequency range.

Further, the use of a filter, such as filter 500, in conjunction with the other filters used in diplex or multiplex filter (e.g., filter 400 described in FIG. 4), create a structure that includes unequal filter orders. For example, highpass filter 420 may be a tenth order filter while lowpass filter 410, implemented as described here for filter 500, is only a third order filter. As a result, the order, or the number of poles, in the termination portion of the diplexer or multiplexer, is less than the number of poles in the active filter portion of the diplexer of multiplexer. Having a lower order filter in the termination portion of the diplexer or multiplexer is advantageous because lower order filters provide better terminating impedance (i.e., the impedance in the terminating circuit is closer to source or input impedance). In contrast, when equal order filters are used, it is more difficult to get good terminating impedance for unused frequency bands (i.e., above and below the MoCA frequency band). Furthermore, lower order filters are smaller than higher order filters, resulting in a reduction of used space within a device containing the filter. Also, the termination circuit is split between two terminating portions to accommodate the frequency range for the home network MoCA signal as well as the termination for signals both above and below the frequency range for the home network MoCA signal.

Figure 6:
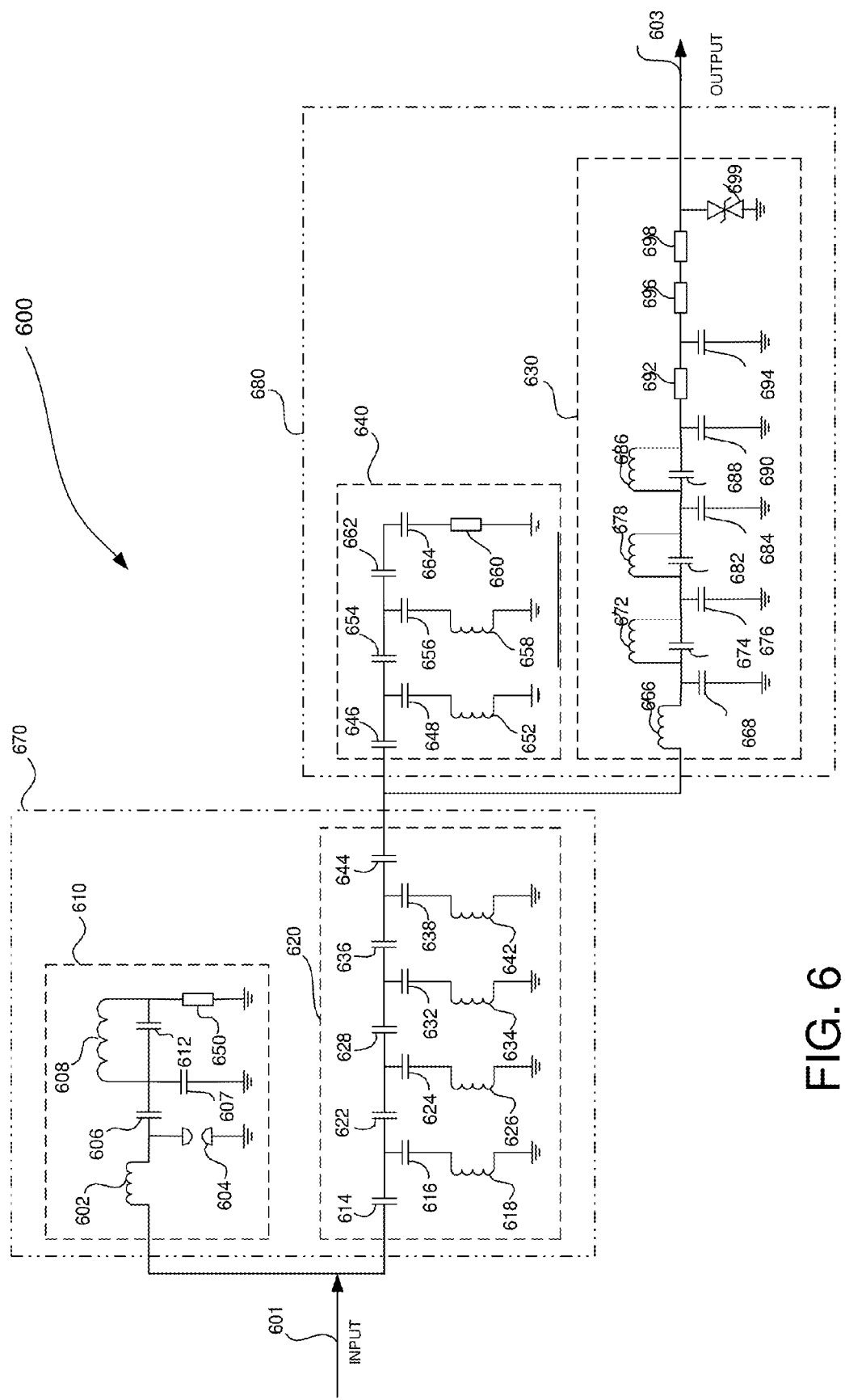
FIG. 6 is a circuit diagram illustrating an exemplary filter used in a device in accordance with the present disclosure.

Turning to FIG. 6, an exemplary circuit diagram for a complete filter 600 according to aspects of the present disclosure is illustrated. It is to be appreciated that filter 600 may be used in a device connected into a home network, such as MoCA network device 140 described in FIG. 1 or set-top box 202 described in FIG. 2 or network device 300 described in FIG. 3.

Filter 600 includes a first diplexer 670 coupled to a second diplexer 680, where diplexer 670 is connected to an input 601 and diplexer 680 is connected to an output 603. It is to be appreciated that the input 601 connected to diplexer 670 may be the output of any device on system 100, 200, or 300 for receiving signals from multiple sources. Furthermore, it is to be appreciated that the output 603 from diplexer 680 may be coupled to a device connected into a home network, such as MoCA network device 140 described in FIG. 1 or MoCA circuit 234 in set-top box 202 described in FIG. 2 or MoCA front end 333 in network device 300 described in FIG. 3.

Diplexer 670 of filter 600 includes lowpass filter/terminator 610, i.e., lowpass terminating circuit, and high pass filter 620. Lowpass terminating circuit 610 includes inductor 602, where one side of inductor 602 is connected to the input 601 of diplexer 670 and the other side of inductor 602 is connected to one side of GDT ("Gas Discharge Tube") 604 and one side of capacitor 606. The other side of GDT 604 is connected to ground. The other side of capacitor 606 is connected to one side of capacitor 607. The other side of capacitor 607 is connected to ground. The other side of capacitor 606 is also connected to one side of inductor 608 and capacitor 612, where inductor 608 and capacitor 612 are connected in parallel. The other sides of inductor 608 and capacitor 612 are both connected to one side of terminating element 650. It is to be appreciated that circuit 610 forms a three pole elliptic type filter with one transmission zero.

Highpass filter 620 includes capacitor 614, where one side of capacitor 614 is connected to the input 601 of diplexer 670. The other side of capacitor 614 is connected to one side of capacitor 616 and capacitor 622. The other side of capacitor 616 is connected to one side of inductor 618. The other side of inductor 618 is connected to ground. The other side of capacitor 622 is connected to one side of capacitor 624 and capacitor 628. The other side of capacitor 624 is connected to one side of inductor 626. The other side of inductor 626 is connected to ground. The other side of capacitor 628 is connected to one side of capacitor 632 and capacitor 636. The other side of capacitor 632 is connected to one side of inductor 634. The other side of inductor 634 is connected to ground. The other side of capacitor 636 is connected to one side of capacitor 638 and capacitor 644. The other side of capacitor 638 is connected to one side of inductor 642. The other side of inductor 642 is connected to ground. The other side of capacitor 644 connected to one side of capacitor 646 in highpass terminating circuit 640 and one side of inductor 666 in lowpass filter 630, where highpass terminating circuit 640 and lowpass filter 630 are both included in diplexer 680. It is important to note that highpass filter 620 operates bidirectionally, receiving signals from the network for the network device and providing signals to the network from the network device.

In highpass filter/terminator 640, i.e., highpass terminating circuit, capacitor 646 is connected to one side of capacitor 648 and capacitor 654. The other side of capacitor 648 is connected to one side of inductor 652. The other side of inductor 652 is connected to ground. The other side of capacitor 654 is connected to one side of capacitor 656 and capacitor 662. The other side of capacitor 656 is connected to one side of inductor 658. The other side of inductor 658 is connected to ground. The other side of capacitor 662 is connected to one side of capacitor 664. The other side of capacitor 664 is connected to terminating element 660. The other side of terminating element 660 is connected to ground. It is to be appreciated that filter 640 forms a 5th order elliptic type filter with minimum inductors.

In lowpass filter 630, inductor 666 is connected to one side of capacitor 668. The other side of capacitor 668 is connected to ground. Inductor 666 is also connected to one side of both inductor 672 and capacitor 674, where inductor 672 and capacitor 674 are connected in parallel. The other sides of inductor 672 and capacitor 674 are connected to one side of capacitor 676. The other side of capacitor 676 is connected to ground. The other side of inductor 672 and capacitor 674 are also connected to one side of inductor 678 and capacitor 682, where inductor 678 and capacitor 682 are connected in parallel. The other sides of inductor 678 and capacitor 682 are connected to one side of capacitor 684. The other side of capacitor 684 is connected to ground. The other side of inductor 678 and capacitor 682 are also connected to one side of inductor 686 and capacitor 688, where inductor 686 and capacitor 688 are connected in parallel. The other side of inductor 686 and capacitor 688 are connected to one side of capacitor 690 and a zero ohm jumper 692. The other side of capacitor 690 is connected to ground. The other side of zero ohm jumper 692 is connected to one side of capacitor 694 and one side of zero ohm jumper 696. The other side of capacitor 694 is connected to ground. The other side of zero ohm jumper 698 is connected to one side of electrostatic discharge ("ESD") diode 699 and the output 603 of filter 600. The other side of ESD diode 699 is connected to ground. It is important to note that lowpass filter 630 operates bidirectionally similar to highpass filter 620. Also, it is to be appreciated that zero ohm jumper 692, 696, and 698 are optional elements of filter 600 and may be removed from filter 600 as these elements do not affect the operation of filter 600.

As described earlier, filter 600 represents a multi-structure cascaded diplex filter with terminations. The order of the filter, or number of poles, for each of portions of filter 600 is not equal. The portions of filter 600 that terminate the unused frequency bands (i.e., lowpass terminating circuit 610 and highpass terminating circuit 640) outside of the frequency range are lower in order than the active portions of filter 600 (i.e., highpass filter 620 and low pass filter 630) used to pass the home network MoCA signals. As described above, it is advantageous to use a lower order filter in the terminating portions of filter 600 (i.e., lowpass terminating circuit 610 and highpass terminating circuit 640) than the active portions of the filter 600 (i.e., highpass filter 620 and low pass filter 630) because lower order filters offer better terminating impedance than higher order filters. Furthermore, lower order filters are smaller, and thus save space in the devices that the filter is used in. Therefore, the use of lowpass terminating circuit 610 and highpass terminating circuit 640 in filter 600 provides better impedance matching than an equal order filter structure would and also save more space.

It is to be appreciated that filter 600 provides better electrostatic discharge protection than filters generally known in the art. This is because low pass filter 610 is designed such that it provides a more effective electrostatic discharge path to ground. Therefore, less undesired electrostatic discharge energy reaches any devices coupled to output 603 of filter 600. For instance, if output 603 of filter 600 is coupled to a MoCA device, less undesired electrostatic discharge energy will reach the MoCA circuit, and therefore, potential damage to the MoCA circuitry is avoided.

Also, although FIG. 6 illustrates diplexer 670 and 680 including terminating elements 650 and 660 respectively, it is to be appreciated that diplexer 670 or diplexer 680 may be designed without terminating element 650 or terminating element 660 as may be necessary by the filtering requirements of different networks and devices. Therefore, any design of filter 600 including only one terminating element in filter 600 (i.e., diplexer 670 or diplexer 680 will not have a terminating element) is contemplated to be within the scope of the present disclosure. Furthermore, any design of filter 600 where filter 600 has no terminating element is also contemplated to be within the scope of the present disclosure.

The following table shows values for one exemplary embodiment of filter 600.

| Element | Value |
|---|---|
| 602 | 12.5 nanohenries |
| 604 | Null |
| 606 | 10 nanofarads |
| 607 | 2.2 picofarads |
| 608 | 5.6 nanohenries |
| 612 | 2.7 picofarads |
| 614 | 2 picofarads |
| 616 | 8 picofarads |
| 618 | 6.8 nanohenries |
| 622 | 2.2 picofarads |
| 624 | 3.9 picofarads |
| 626 | 9.5 nanohenries |
| 628 | 2.2 picofarads |

-continued

| Element | Value |
| --- | --- |
| 632 | 3.6 picofarads |
| 634 | 10 nanohenries |
| 636 | 2.4 picofarads |
| 638 | 100 picofarads |
| 642 | 7.5 nanohenries |
| 644 | 8 picofarads |
| 646 | 1.5 picofarads |
| 648 | 1.5 picofarads |
| 650 | 75 ohm |
| 652 | 12 nanohenries |
| 654 | 2 picofarads |
| 656 | 68 picofarads |
| 658 | 6.8 nanohenries |
| 660 | 86 ohm |
| 662 | 1.6 picofarads |
| 664 | 68 picofarads |
| 666 | 11 nanohenries |
| 668 | 2.7 picofarads |
| 672 | 11 nanohenries |
| 674 | 0.8 picofarads |
| 676 | 1.8 picofarads |
| 678 | 10 nanohenries |
| 682 | 1.2 picofarads |
| 684 | 1.8 picofarads |
| 686 | 10 nanohenries |
| 688 | 0.7 picofarads |
| 690 | 1.2 picofarads |
| 692 | 0 ohm |
| 694 | 0 picofarads |
| 696 | 0 ohm |
| 698 | 0 ohm |
| 699 | Null |

Figure 7:
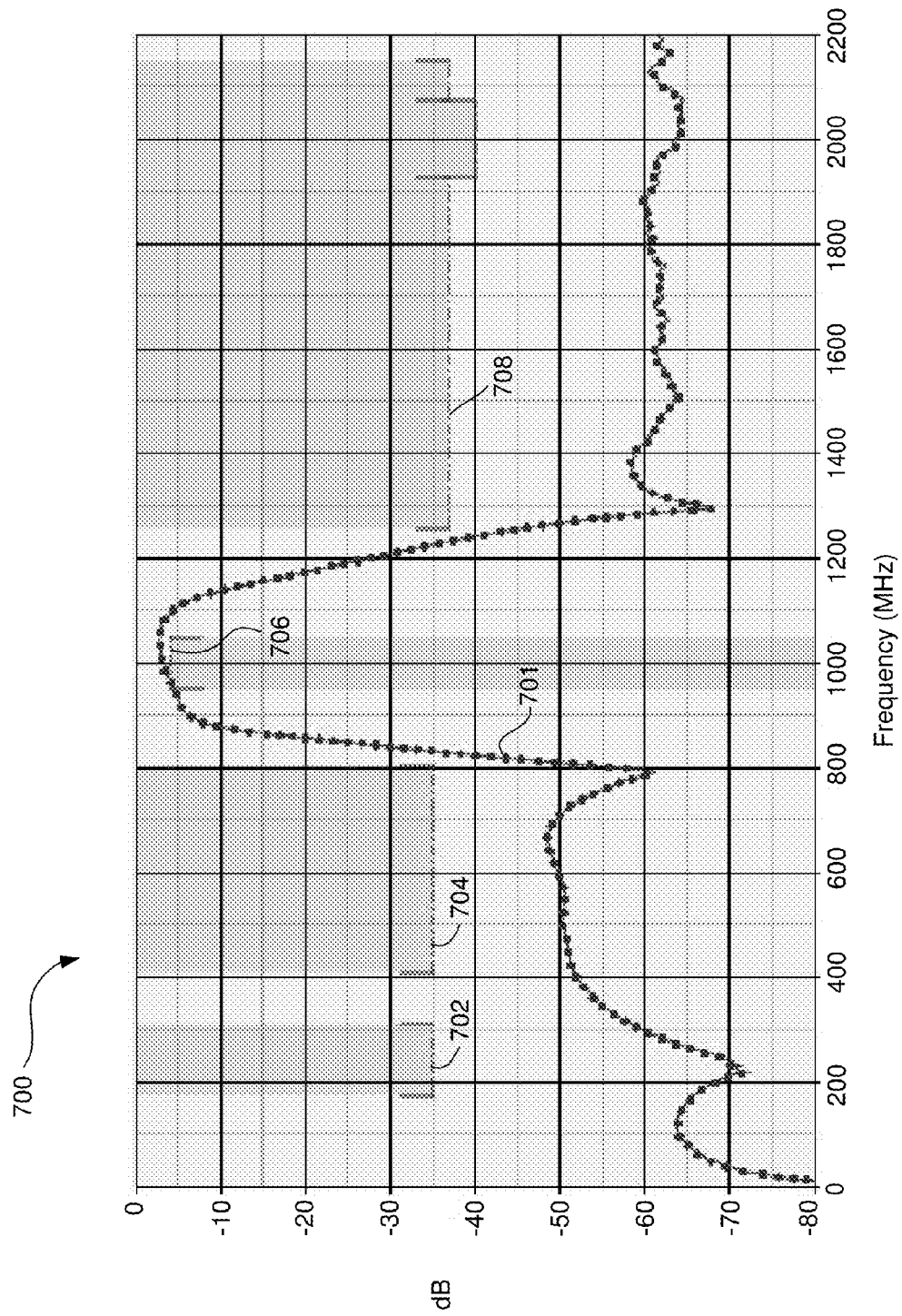
FIG. 7 is a graph illustrating a measured frequency response of the exemplary filter of FIG. 6 in accordance with the present disclosure.

Turning to FIG. 7, a graph 700 is illustrated that shows a measured frequency response for signals being provided to filter 600 in accordance with the present disclosure as element 701. Specifically, the x-axis represents the frequency (measured in MHz) of the signals being provided to filter 600 and the y-axis represents the magnitude associated with the response of a signal being provided to filter 600 (measured in dB) at a given frequency.

Graph 700 includes elements 702, 704, 706, and 708, where elements 702, 704 and 708 represent design goals for the terminated frequency ranges in filter 600 and element 706 represents the design goal for the passband frequency range in filter 600. Specifically, for elements 702, 704 and 708, the design goal is for filter 600 to elicit a frequency response associated with signals passing through filter 600 that is below elements 702, 704, and 708. Additionally, for element 706, the design goal is for filter 600 to elicit a frequency response associated with signals passing through filter 600 that is above element 706. As seen in graph 700 of FIG. 7, the frequency response in the ranges of elements 702, 704 and 708 are below the design goal and the signals in these frequency ranges will be terminated in filter 600. In contrast, the frequency response in the range of element 706 is above the design goal, and therefore the signals in this frequency range will be passed by filter 600.

Figure 8:
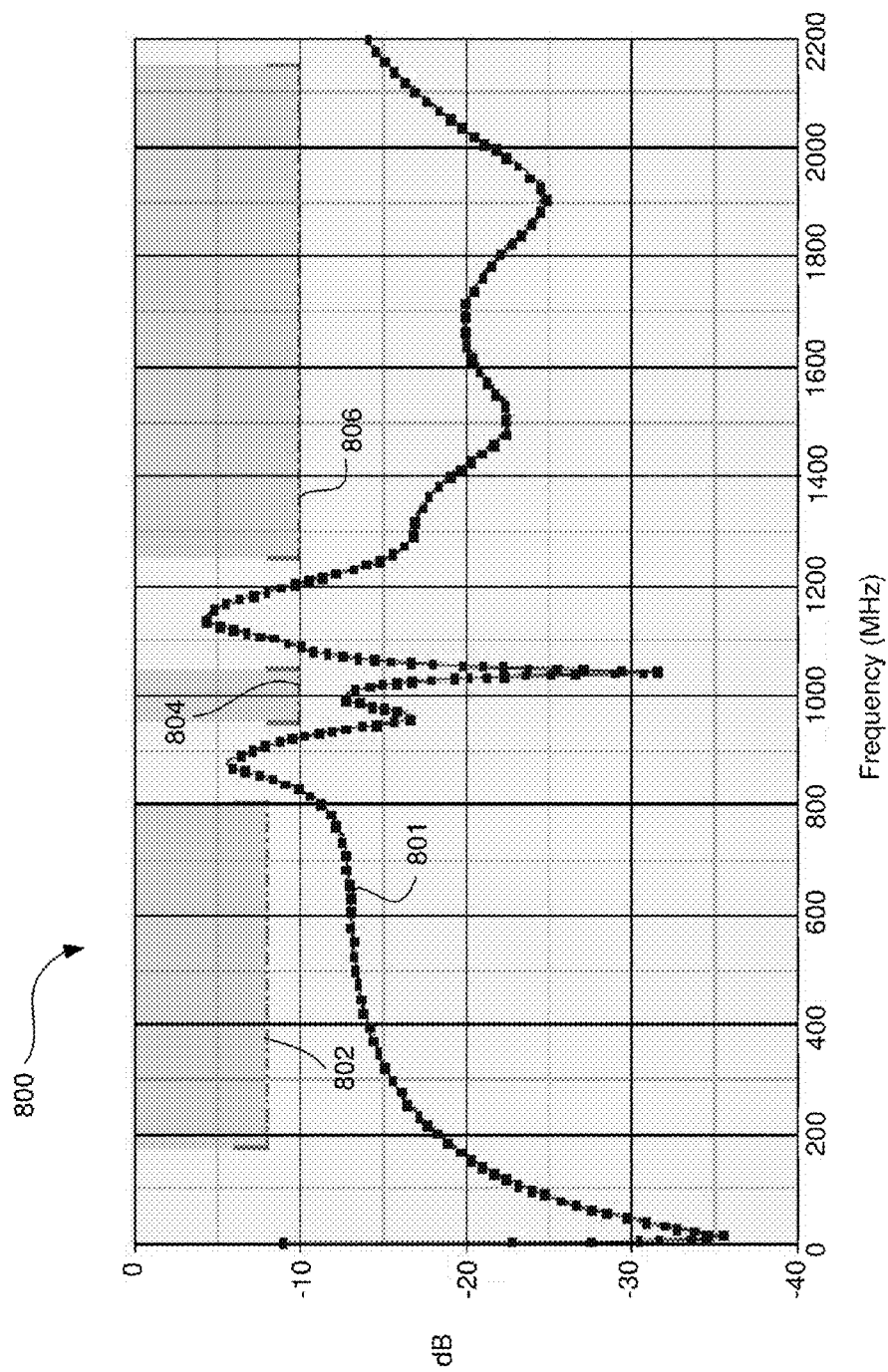
FIG. 8 is a graph illustrating a measured return loss of the exemplary filter of FIG. 6 in accordance with the present disclosure.

Turning to FIG. 8, a graph 800 is illustrated that shows a measured return loss of the signals being provided to filter 600 in accordance with the present disclosure as element 801. As in graph 700, in graph 800, the x-axis represents the frequency (measured in MHz) of the signals being provided to filter 600 and the y-axis represent the negative value of the return loss (measured in dB) of the signals being provided to filter 600 at a given frequency. It is to be appreciated that in graph 800, the lower the return loss (i.e., the more negative the return loss is), the better the impedance matching will be for those frequencies.

Graph 800 includes elements 802, 804, and 806, where elements 802 and 806 are the return loss design goals for signals in the terminated frequency ranges in filter 600 and element 804 is the return loss goal for signal in the passband frequency range in filter 600. Specifically, for elements 802, 804 and 806, the design goal is for filter 600 to elicit return loss associated with signals passing through filter 600 that is below elements 802, 804, and 706. As seen in graph 800 of FIG. 8, the return loss for signals in the frequencies in the ranges of elements 802, 804, and 806 are below the design goal, and therefore, the signals in these frequency bands will have good impedance matching.

Figure 9:
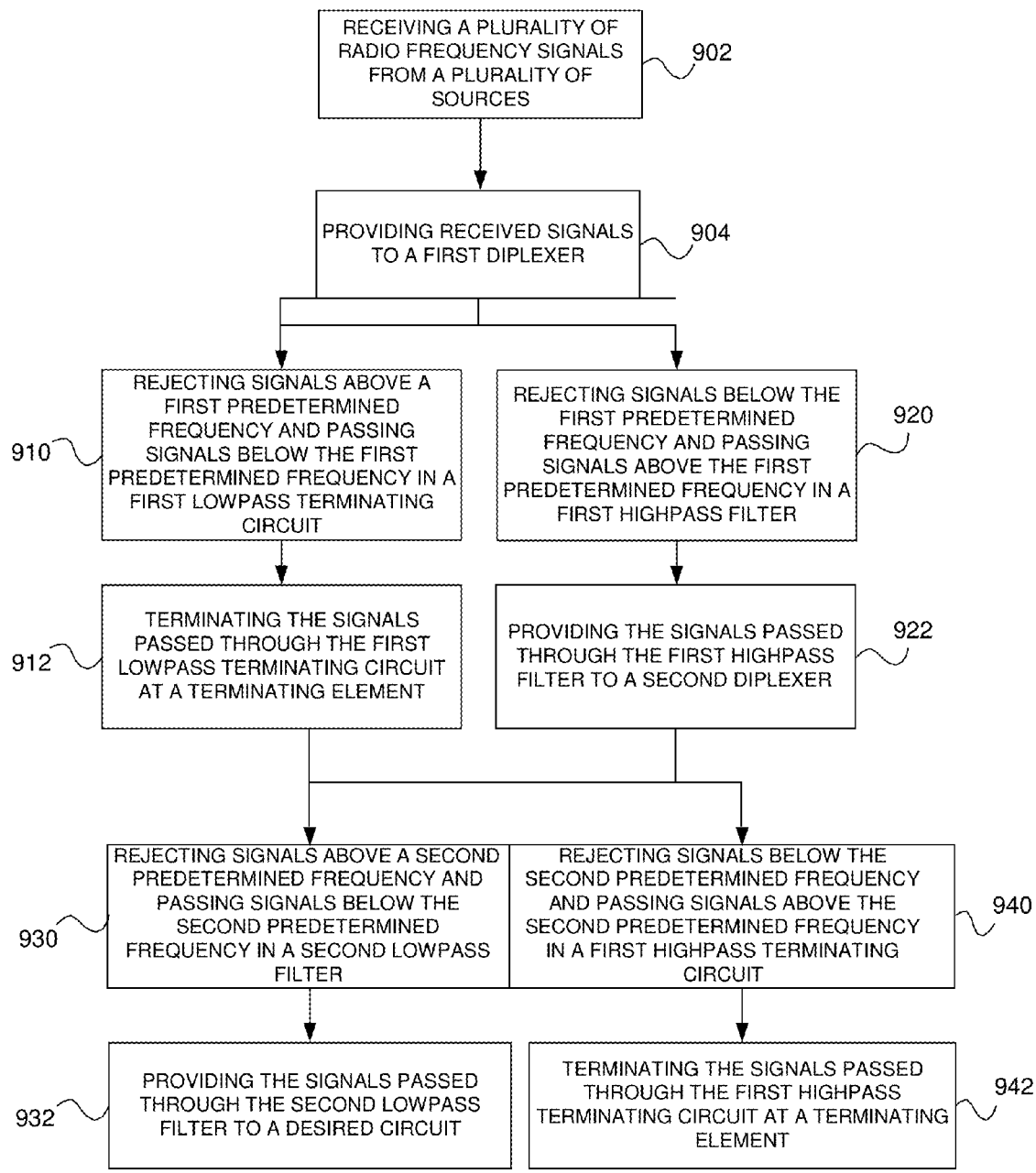
FIG. 9 is a flowchart of an exemplary method for filtering signals received on a network in accordance with the present disclosure.

Turning to FIG. 9, a flow chart of an exemplary method 900 for filtering signals received on a home network is shown in accordance with the present disclosure. Although method 900 is described with respect to filter 600, it is to be appreciated that the steps of method 900 may be applied to filter 303 of FIG. 3 and filter 400 of FIG. 4. Furthermore, it is to be appreciated that although the method 900 is described below as using filter 600 to attenuate or terminate signals outside the MoCA frequency range, while passing signals in the MoCA frequency range, filter 600 may be used with method 900 to filter signals in other desired frequency ranges as well.

In step 902, at the input 601, filter 600 receives a plurality of radio frequency signals from a plurality of sources. For instance, the received signals may include both satellite and terrestrial or cable broadcast signals as well as home network or MoCA signals. After filter 600 receives the signals from the input, in step 904, the received signals are provided to diplexer 670. In diplexer 670, the received signals are provided simultaneously to lowpass terminating circuit 610, and highpass filter 620.

In step 910, lowpass terminating circuit 610 rejects or attenuates home network or MoCA signals with frequencies above 950 MHz. However, the terrestrial or cable broadcast signals and any lower frequency SWM satellite communication signals, are filtered and passed through lowpass terminating circuit 610. Then, in step 912, the signals passing through lowpass terminating circuit 610 are terminated (i.e., not passed further) at element 650. It is to be appreciated that lowpass terminating circuit 610 is designed such that the impedance of any terminated signals (i.e., SWM and ISDB-T signals) are matched.

In step 920, highpass filter 620 passes the home network or MoCA signals with frequencies above 950 MHz for use in MoCA signal processing circuits. Highpass filter 620 rejects or attenuates the terrestrial or cable broadcast signals and prevents these signals from appearing in MoCA signal processing circuits in the network device. In step 922, the signals passed by highpass filter 620, still including both satellite home network or MoCA signals, are provided to the second diplexer 680 of filter 600. The signals provided to diplexer 680 are simultaneously provided to lowpass filter 630, and highpass terminating circuit 640.

In step 930, lowpass filter 630 passes the home network or MoCA signals with frequencies below 1050 MHz. However, lowpass filter 630 rejects or attenuates the satellite signals and prevents these signals from appearing in MoCA signal processing circuits in the network device. In step 932, lowpass filter 630 provides the signals passed by lowpass filter 630 to an output for use in MoCA signal processing circuits. It is to be appreciated that the output signal 306 is in the range of about 950 MHz to about 1050 MHz.

In step 940, highpass terminating circuit 640 rejects or attenuates the home network or MoCA signals with frequencies below 1250 MHz. However, the terrestrial or cable broadcast signals and any lower frequency SWM satellite communication signals provided to highpass terminating circuit 640, are filtered and passed through highpass terminating circuit 640. In step 942, the signals passing through highpass terminating circuit 640 are terminated (i.e., not passed further) at element 660. It is to be appreciated that highpass terminating circuit 640 is designed such that the impedance of any terminated signals are matched.

A simplified filter structure, and method thereof, for filtering signals received on a network are provided. The present disclosure is directed to a simplified filter structure, arranged as a dual unbalanced cascade diplexer for a plurality of received signals, including satellite, terrestrial, and home networking signals, e.g., Multimedia Over Cable Alliance (MoCA) signals. The simplified filter structure is designed such that signals within a certain predetermined frequency range are passed, while the impedance is matched or terminated in a stopband frequency range for any signals present in this frequency range. The termination may be present for signals in a stopband frequency range that may be both above and below the frequency range of the passed signals. Unlike traditional diplexer structures, the portion of the structure that provides the impedance matching in the stopband frequency range or ranges above and below the frequency range of the passed signals is smaller in structure than the filter portion that passes the signals. The smaller structure may include less frequency poles used to form a frequency response and may further include fewer physical components in the structure. The smaller structure leads to the unbalanced nature of the diplexer structure.

Although embodiments which incorporate the teachings of the present disclosure have been shown and described in detail herein, those skilled in the art can readily devise many other varied embodiments that still incorporate these teachings. Having described preferred embodiments (which are intended to be illustrative and not limiting), it is noted that modifications and variations can be made by persons skilled in the art in light of the above teachings. It is therefore to be understood that changes may be made in the particular embodiments of the disclosure disclosed which are within the scope of the disclosure as outlined by the appended claims.

What is claimed:

1. An apparatus comprising:
    a first diplexer that receives signals from multiple sources on a network, the received signals including at least one of a satellite signal, a terrestrial broadcast signal, a cable broadcast signal, and a multimedia over cable alliance (MoCA) signal, the first diplexer having a first filter portion that passes signals above a first predetermined frequency; and
    a second diplexer that receives the signals above the first predetermined frequency, the second diplexer having a first filter portion that passes signals below a second predetermined frequency, the second predetermined frequency being greater than the first predetermined frequency, wherein the signals passed by the second diplexer is a multimedia over cable alliance (MoCA) signal,
    wherein at least one of a second filter portion of the first diplexer and a second filter portion of the second diplexer terminates signals in a respective stopband frequency with a matched impedance.

2. The apparatus of claim 1, wherein the first diplexer includes at least one first lowpass terminating circuit and at least one first highpass filter, the first lowpass terminating circuit including at least one first lowpass filter and one first terminating element that terminates signals below the first predetermined frequency.

3. The apparatus of claim 2, wherein the at least one first lowpass filter is a three pole elliptic type filter formed with one transmission zero.

4. The apparatus of claim 2, wherein a number of poles of the at least one first highpass filter is greater than a number of poles of the at least one first lowpass terminating circuit.

5. The apparatus of claim 2, wherein the second diplexer includes at least one second lowpass filter and at least one first highpass terminating circuit, the first highpass terminating circuit including at least one second highpass filter and one second terminating element that terminates signals above the second predetermined frequency.

6. The apparatus of claim 5, wherein the at least one second highpass filter is a 5th order elliptic type filter with minimum inductors.

7. The apparatus of claim 5, wherein a number of poles of the at least one second lowpass filter is greater than a number of poles of the at least one first highpass terminating circuit.

8. The apparatus of claim 1, wherein the second diplexer includes at least one second lowpass filter and at least one first highpass terminating circuit, the first highpass terminating circuit including at least one second highpass filter and one second terminating element that terminates signals above the second predetermined frequency.

9. The apparatus of claim 8, wherein the at least one second highpass filter is a 5th order elliptic type filter with minimum inductors.

10. The apparatus of claim 8, wherein a number of poles of the at least one second lowpass filter is greater than a number of poles of the at least one first highpass terminating circuit.

11. The apparatus of claim 1, wherein the first predetermined frequency is about 950 Megahertz (MHz) and the second predetermined frequency is about 1050 MHz.

12. A method comprising:
    receives signals at a first diplexer from multiple sources on a network, the received signals including at least one of a satellite signal, a terrestrial broadcast signal, a cable broadcast signal, and a multimedia over cable alliance (MoCA) signal;
    passing signals above a first predetermined frequency to a second diplexer;
    receiving the signals above the first predetermined frequency by the second diplexer and passing signals below a second predetermined frequency, the second predetermined frequency being greater than the first predetermined frequency, wherein the signals passed by the second diplexer is a multimedia over cable alliance (MoCA) signal; and
    terminating signals in at least one of a stopband frequency range of the first diplexer and a stopband frequency range of the second diplexer with a matched impedance.

13. The method of claim 12, wherein the first diplexer includes at least one first lowpass terminating circuit and at least one first highpass filter, the first lowpass terminating circuit including at least one first lowpass filter and one first terminating element that terminates signals below the first predetermined frequency.

14. The method of claim 13, wherein the at least one first lowpass filter is a three pole elliptic type filter formed with one transmission zero.

15. The method of claim 13, wherein a number of poles of the at least one first highpass filter is greater than a number of poles of the at least one first lowpass terminating circuit.

16. The method of claim 13, wherein the second diplexer includes at least one second lowpass filter and at least one first highpass terminating circuit, the first highpass terminating circuit including at least one second highpass filter and one second terminating element that terminates signals above the second predetermined frequency.

17. The method of claim 16, wherein the at least one second highpass filter is a 5th order elliptic type filter with minimum inductors.

18. The method of claim 16, wherein a number of poles of the at least one second lowpass filter is greater than a number of poles of the at least one first highpass terminating circuit.

19. The method of claim 12, wherein the second diplexer includes at least one second lowpass filter and at least one first highpass terminating circuit, the first highpass terminating circuit including at least one second highpass filter and one second terminating element that terminates signals above the second predetermined frequency.

20. The method of claim 19, wherein the at least one second highpass filter is a 5th order elliptic type filter with minimum inductors.

21. The method of claim 19, wherein a number of poles of the at least one second lowpass filter is greater than a number of poles of the at least one first highpass terminating circuit.

22. The method of claim 12, wherein the first predetermined frequency is about 950 MHz and the second predetermined frequency is about 1050 MHz.

* * * * *